United States Patent [19]
Brasen et al.

[11] Patent Number: 5,187,864
[45] Date of Patent: Feb. 23, 1993

[54] ADAPTABLE TOPOLOGIES USED IN ROUTING OF GROUND AND POWER NETWORKS ON INTEGRATED CIRCUITS

[75] Inventors: Daniel R. Brasen, San Francisco; Dale M. Wong, San Francisco, both of Calif.

[73] Assignee: VLSI Technology, Inc., San Jose, Calif.

[21] Appl. No.: 736,666

[22] Filed: Jul. 26, 1991

[51] Int. Cl.5 .............................................. H05K 3/00
[52] U.S. Cl. ....................................... 29/846; 364/491
[58] Field of Search ................... 29/846; 364/488, 489, 364/490, 491

[56] References Cited

PUBLICATIONS

Krohn, Howard E.; An Over-Cell Gate Array Channel Router; p.41.1; 20th Design Automation Conf.; IEEE 1983.

Hudson, J. A., et al.; Rectilinear Area Routing: A Channel Router Approach; IEEE Custom Integrated Circuits Conf., Portland, Oreg.; May 20–23, 1985.

Fukui, Masahiro, et al., Block Interconnection Algorithm For Hierarchial Layout System; IEEE Transactions on Computer-Aided Design, vol. CAD-6, No. 3, May 1987.

Shinichiro Haruyama and Don Fussell, *A New Area-Efficient Power Routing Algorithm for VLSI Layout*, IEEE, 1987.

D. F. Wong and C. L. Liu, *A New Algorithm for Flooplan Design*, 23rd Design Automation Conference, 1986, pp. 101–107.

Charles Ng, Sunil Ashtaputre, Elizabeth Chambers, Kieu–huong Do, Siu–tong Hui, Rajiv Mody, and Dale Wong, *A Hierarchical Floor-Planning, Placement, and Routing Tool for Sea-of-Gates Designs*, Custom Integrated Circuits Conference, IEEE 1989, pp. 3.3.1–3.3.4.

Andrew Strout Moulton, *Routing the Power and Ground Wires on a VLSI Chip*, a Masters Thesis for the Massachusetts Institute of Technology, MIT/LCS/TR–322, May, 1984.

Xiao-Ming Xiong and Ernest S. Kuh, *The Scan Line Approach to Power and Ground Routing*, IEEE, 1986.

S. Chowdhury, *An Automated Design of Minimum-Area IC Power/Ground Nets*, 24th/ACM/IEEE Design Automation Conference, 1987.

*Primary Examiner*—P. W. Echols
*Attorney, Agent, or Firm*—Douglas L. Weller

[57] ABSTRACT

A method performs global routing of a power line network and a ground line network on an integrated circuit. Pre-formed segments of the ground line network are placed adjacent to functional blocks of the integrated circuit. Ground lines of the functional blocks are connected to the pre-formed segments of the ground line network. In addition, pre-formed segments of the power line network are placed adjacent to the functional blocks of the integrated circuit. Power lines of the functional blocks are connected to the pre-formed segments of the power line network. Once the pre-formed segments have all been placed, the pre-formed segments of the ground line network are connected together and the pre-formed segments of the power line network are connected together.

6 Claims, 6 Drawing Sheets

ADAPTABLE TOPOLOGIES USED IN ROUTING OF GROUND AND POWER NETWORKS ON INTEGRATED CIRCUITS

BACKGROUND

The present invention concerns the use of adaptable topologies in the routing of ground and power networks on an integrated circuit. The invention can also be used in the placement of other special networks such as those used to connect networks which provide a clock signal to component blocks within the integrated circuit.

Once the logic circuitry for a very large scale integrated (VLSI) circuit has been designed, placement algorithms are used to place the VLSI circuit logic efficiently upon a chip. The integrated circuit is generally divided into component blocks of logic circuits. The logic circuits are often referred to as logic cells. Each of the component blocks occupies a fixed area when placed on the chip. Each component block is connected to other component blocks through wire networks, also called connection networks. The connection networks include connection networks which supply a power signal and a ground signal to each of the component blocks. Connection networks which supply a power signal may be referred to as a power line network. Connection networks which supply a ground signal may be referred to as a ground line network.

Connection networks have a measurable width and take up space on the integrated circuit which is directly proportional to their length. Therefore, when routing connection networks between component blocks, it is desirable to find a routing path which minimizes the total length of the connection networks.

For examples of the routing of power line networks and ground line networks in the prior art, see for example, Andrew Strout Moulton, *Routing the Power and Ground Wires on a VLSI Chip*, a Masters Thesis for the Massachusetts Institute of Technology, MIT/LCS/TR-322, May, 1984. See also Xiao-Ming Xiong and Ernest S. Kuh, *The Scan Line Approach to Power and Ground Routing*, IEEE, 1986; S. Chowdhury, *An Automated Design of Minimum-Area IC Power/Ground Nets*, 24th/ACM/IEEE Design Automation Conference, 1987; and Shinichiro Haruyama and Don Fussell, *A New Area-Efficient Power Routing Alcorithm for VLSI Layout*, IEEE, 1987.

The routing of power line networks and ground line networks on an integrated circuit is more idiosyncratic that normal routing. Depending on the particular circuit and technology being used, there can be constraints on the maximum number of pins connected to a single source, or the amount of overlap allowed between power and ground routing. In addition, a circuit designer may need a particular topology such as power and ground rings to shield the integrated circuit, or such as ladder routing to connect power or ground routing to a pad ring. Such topologies cannot be generated with a generic router, and therefore, special case routers are usually constructed. In situations where the special routers are inadequate or cannot be constructed in time, the circuit designer must manually route the power and ground line networks. However, such manual routing can be extremely complicated as, in a typical case, power and networks may have hundreds of connections.

SUMMARY OF THE INVENTION

In accordance with the preferred embodiment of the present invention, a method is presented for performing global routing of a power line network and a ground line network on an integrated circuit. Pre-formed segments of the ground line network are placed adjacent to functional blocks of the integrated circuit. Ground lines of the functional blocks are connected to the pre-formed segments of the ground line network. In addition, pre-formed segments of the power line network are placed adjacent to the functional blocks of the integrated circuit. Power lines of the functional blocks are connected to the pre-formed segments of the power line network. Once the pre-formed segments have all been placed, the pre-formed segments of the ground line network are connected together and the pre-formed segments of the power line network are connected together. This may be done, for example, using an expansion routing algorithm.

The pre-formed segments can be any shape which may be conveniently connected together. For example, for functional blocks which are functional blocks of standard cells, the pre-formed segments of the ground line network and the pre-formed segments of the power line network may be three-sided segments. The pre-formed segments of the ground line network may be open towards either a first side or a second side of the integrated circuit while the pre-formed segments of the power line network are open towards either a third side or a fourth side of the integrated circuit. For example, the pre-formed segments of the ground line network may be opened toward the top or toward the left side of the integrated circuit. Similarly, the pre-formed segments of the power line network may be opened toward the bottom or toward the right side of the integrated circuit.

DESCRIPTION OF THE PREFERRED EMBODIMENT

Figure 1:
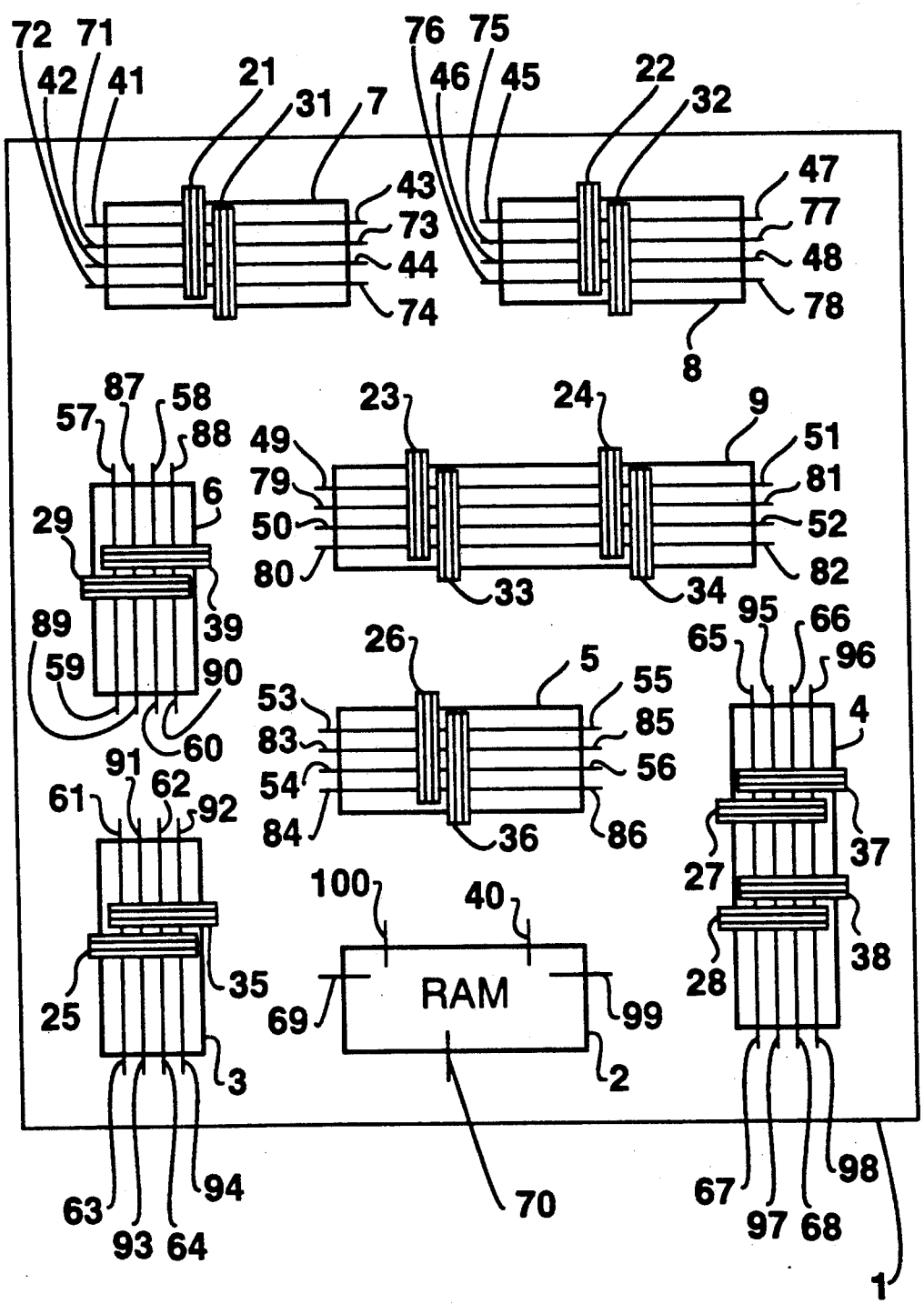
FIG. 1 shows a layout of an integrated circuit before global routing of a power line network and a ground line network.

FIG. 1 shows functional blocks of an integrated circuit 1 arranged in a floor plan. The functional blocks include a RAM block 2, a block of standard cells 3, a block of standard cells 4, a block of standard cells 5, a block of standard cells 6, a block of standard cells 7, a block of standard cells 8 and a block of standard cells 9. The placement of the functional block might be done, for example, using a standard floor-planning algorithm. See for example, D. F. Wong and C. L. Liu, *A New Algorithm for Floorplan Design*, 23rd Design Automation Conference 1986, pp. 101–107. See also Charles Ng, Sunil Ashtaputre, Elizabeth Chambers, Kieu-huong Do, Siutong Hui, Rajiv Mody, and Dale Wong, *A Hierarchical Floor-Planning, Placement, and Routing Tool for Sea-of-Gates Designs*, Custom Integrated Circuits Conference, IEEE 1989, pp. 3.3.1–3.3.4.

Once the functional blocks have been placed it is necessary to connect them to a power line network and a ground line network. For example, standard cell block 7 needs to be connected to the ground line network at a ground strap 31, a ground line 71, a ground line 72, a ground line 73 and a ground line 74. Standard cell block 8 needs to be connected to the ground line network at a ground strap 32, a ground line 75, a ground line 76, a ground line 77 and a ground line 78. Standard cell block 9 needs to be connected to the ground line network at a ground strap 33, a ground strap 34, a ground line 79, a ground line 80, a ground line 81 and a ground line 82. Standard cell block needs to be connected to the ground line network at a ground strap 36, a ground line 83, a ground line 84, a ground line 85 and a ground line 86. Standard cell block 6 needs to be connected to the ground line network at a ground strap 39, a ground line 87, a ground line 88, a ground line 89 and a ground line 90. Standard cell block 3 needs to be connected to the ground line network at a ground strap 35, a ground line 91, a ground line 92, a ground line 93 and a ground line 94. Standard cell block 4 needs to be connected to the ground line network at a ground strap 37, a ground strap 38, a ground line 95, a ground line 96 a ground line 97 and a ground line 98. RAM block 2 needs to be connected to the ground line network at a ground line 99 and a ground line 100.

Similarly, standard cell block 7 needs to be connected to the power line network at a power strap 21, a power line 41, a power line 42, a power line 43 and a power line 44. Standard cell block 8 needs to be connected to the power line network at a power strap 22, a power line 45, a power line 46, a power line 47 and a power line 48. Standard cell block 9 needs to be connected to the power line network at a power strap 23, a power strap 24, a power line 49, a power line 50, a power line 51 and a power line 52. Standard cell block 5 needs to be connected to the power line network at a power strap 26, a power line 53, a power line 54, a power line 55 and a power line 56. Standard cell block 6 needs to be connected to the power line network at a power strap 29, a power line 57, a power line 58, a power line 59 and a power line 60. Standard cell block 3 needs to be connected to the power line network at a power strap 25, a power line 61, a power line 62, a power line 63 and a power line 64. Standard cell block 4 needs to be connected to the power line network at a power strap 27, a power strap 28, a power line 65, a power line 66 a power line 67 and a power line 68. RAM block 2 needs to be connected to the power line network at a power line 69, a power line 70 and a power line 40.

Figure 2:
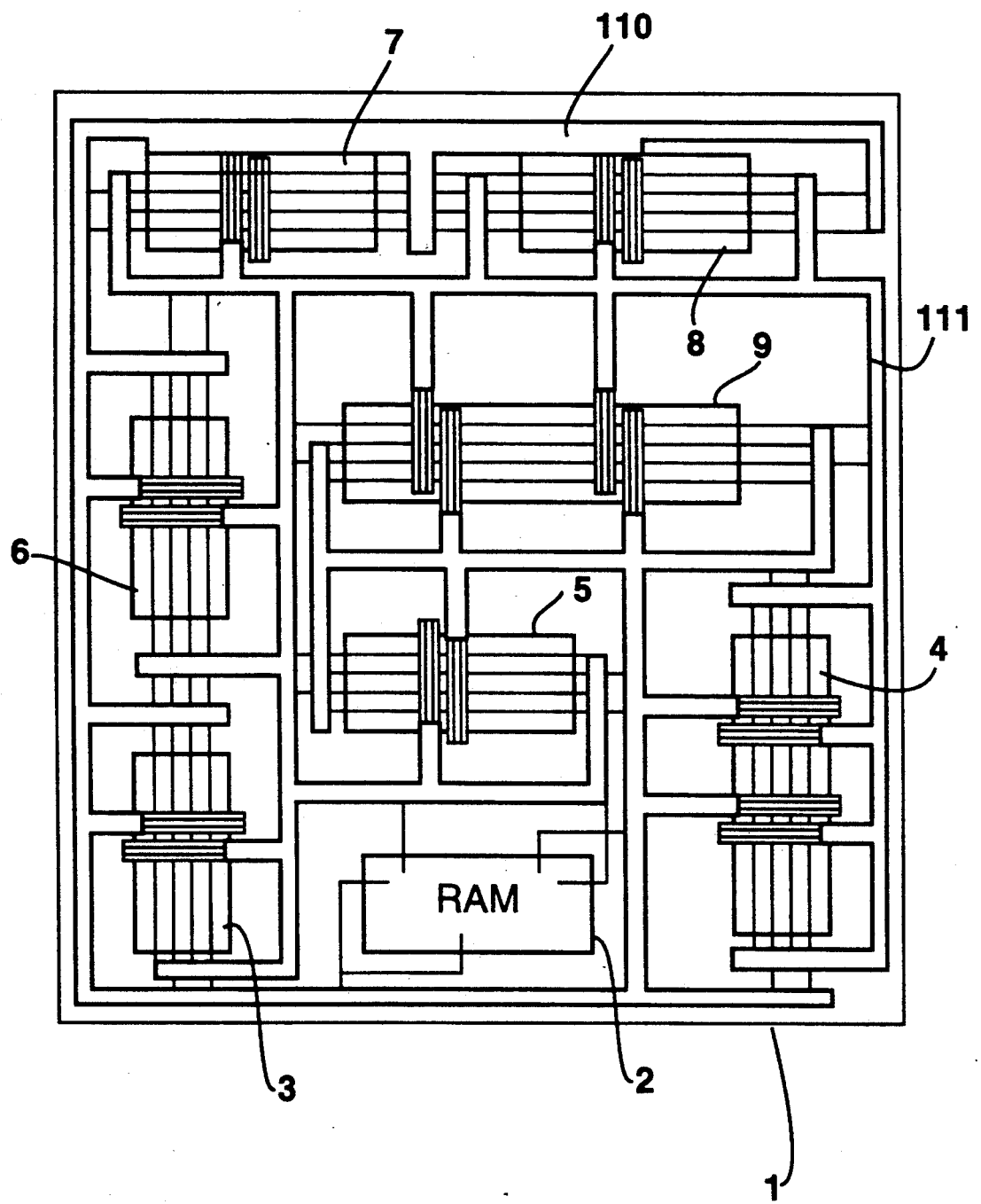
FIG. 2 shows the result of a prior art method of global routing of a power line network and a ground line network on the integrated circuit shown in FIG. 1.

Using a conventional routing algorithm, it is often possible to come up with non-overlapping routes for a power line network and a ground line network. For example, FIG. 2 shows such routes. A power line network 111 is connected to power straps 21 through 27 and to power lines 40 through 70. A ground line network 110 is connected to power straps 31 through 37 and to ground lines 71 through 100. While in many cases, such as the present example, it is possible to find routes for connection networks of power lines and ground lines, other times such a route is difficult to find or impossible to find using conventional routing algorithms.

Figure 3:
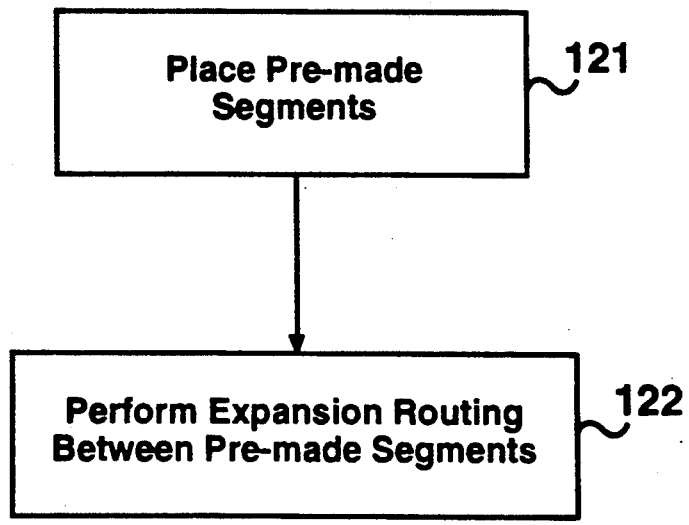
FIG. 3 sets out a flowchart of a method for performing a global route of a power line network and a ground line network in accordance with the preferred embodiment of the present invention.

FIG. 3 shows a method in accordance with the preferred embodiment of the present invention which may be used as an alternate to conventional power and ground routing algorithms. In the present method, in a step 121, pre-formed segments of connector networks are placed on the integrated circuit. These pre-formed segments are based on a priori information which is associated with a type of layout. Once these pre-formed segments have been placed, expansion routing is used to connect together the pre-formed segments.

Figure 4:
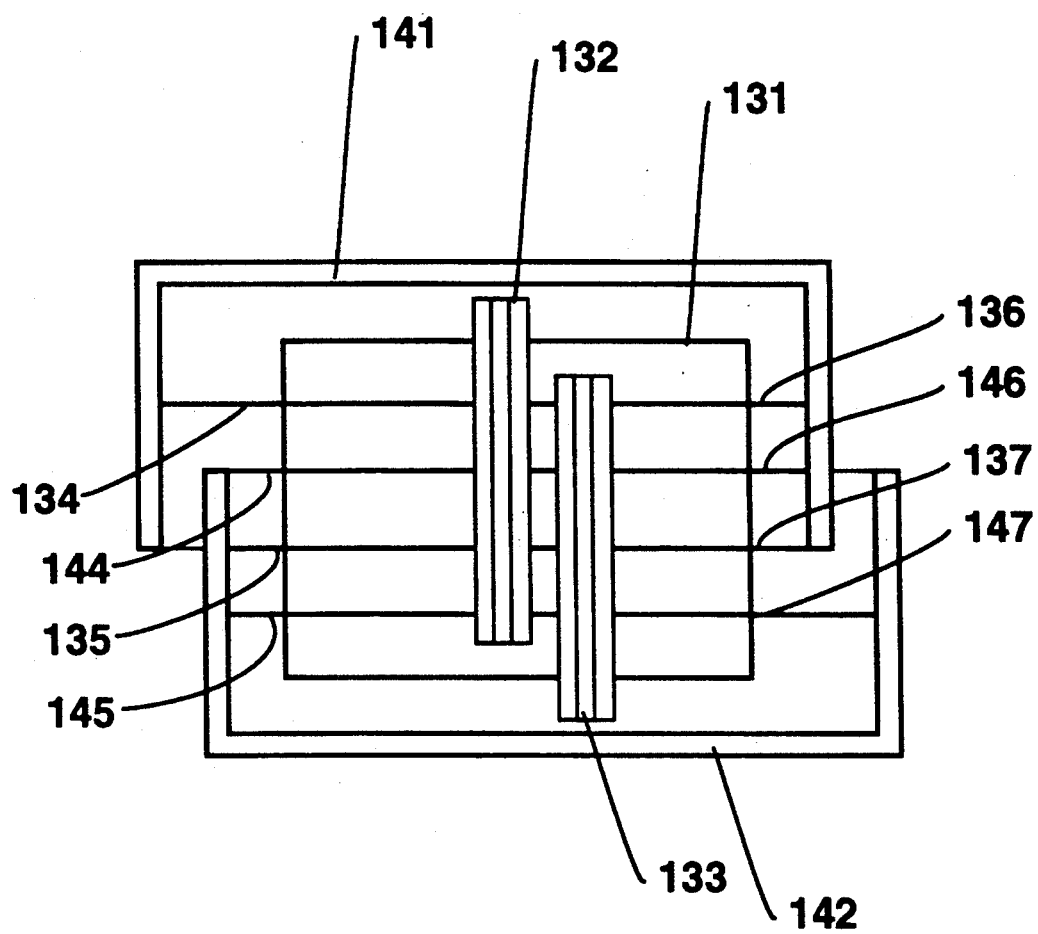
FIG. 4 shows pre-formed segments of a power line network and a ground line network placed around a functional block of standard cells in accordance with the preferred embodiment of the present invention.

For example, FIG. 4 shows a convention which may be used for supplying power and ground signals to a hierarchical block. In this convention, each hierarchical block is surrounded by a two "C" shaped segments opening in opposite directions. As shown in FIG. 4, a segment 142 of a ground connection network and a segment 141 of a power connection network are shown surrounding a functional block of standard cells 131. Segment 142 of the ground connection network is connected to a ground strap 133 and to a ground line 144, a ground line 145, a ground line 146 and a ground line 147. Segment 141 of the power connection network is connected to a power strap 132, a power line 134, a power line 135, a power line 136 and a power line 137.

Figure 5:
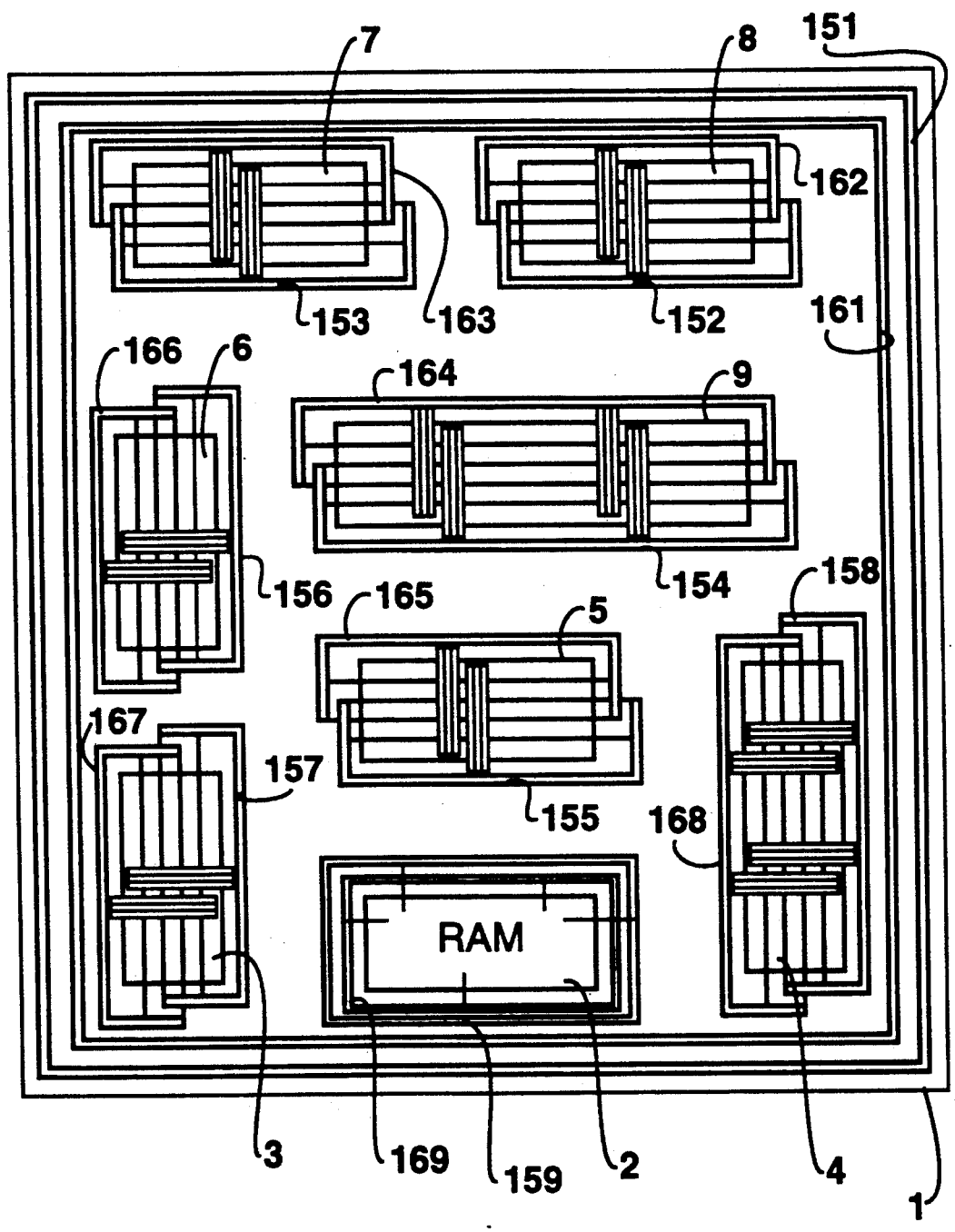
FIG. 5 shows pre-formed segments of a power line network and a ground line network placed around functional blocks of standard cells shown in FIG. 1 in accordance with the preferred embodiment of the present invention.

FIG. 5 shows pre-formed segments placed on integrated circuit 1. The pre-formed segments are three-sided with one side of the pre-formed segments left open. In FIG. 5, when placed around hierarchical blocks, the three-sided segments are placed so that segments of the ground connection network are open either to the top or to the left of integrated circuit 1 and segments of the power connection network are open either to the bottom or to the right of integrated circuit 1. This convention allows the segments to be connected to the appropriate connection network with a minimum amount of overlap.

Specifically, a ground segment 153 for standard cell block 7 is connected to ground strap 31, ground line 71, ground line 72, ground line 73 and ground line 74. A ground segment 152 for cell block 8 is connected to ground strap 32, ground line 75, ground line 76, ground line 77 and ground line 78. A ground segment 154 for cell block 9 is connected to ground strap 33, ground strap 34, ground line 79, ground line 80, ground line 81 and ground line 82. A ground segment 155 for cell block 5 is connected to ground strap 36, ground line 83, ground line 84, ground line 85 and ground line 86. A ground segment 156 for cell block 6 is connected to ground strap 39, ground line 87, ground line 88, ground line 89 and ground line 90. A ground segment 157 for cell block 3 is connected to ground strap 35, ground line 91, ground line 92, ground line 93 and ground line 94. A ground segment 158 for cell block 4 is connected to ground strap 37, ground strap 38, ground line 95, ground line 96 ground line 97 and ground line 98.

Similarly, A power segment 163 for cell block 7 is connected to power strap 21, power line 41, power line 42, power line 43 and power line 44. A power segment 162 for cell block 8 is connected to power strap 22, power line 45, power line 46, power line 47 and power line 48. A power segment 164 for cell block 9 is connected to power strap 23, power strap 24, power line 49, power line 50, power line 51 and power line 52. A power segment 165 for cell block 5 is connected to power strap 26, power line 53, power line 54, power line 55 and power line 56. A power segment 166 for cell block 6 is connected to power strap 29, power line 57, power line 58, power line 59 and power line 60. A power segment 167 for cell block 3 is connected to power strap 25, power line 61, power line 62, power line 63 and power line 64. A power segment 168 for cell block 4 is connected to power strap 27, power strap 28, power line 65, power line 66 power line 67 and power line 68.

In addition to three-sided segments around standard cell blocks, different shaped pre-formed segments are used. For example, a ground ring 159 surrounds RAM block 2 and is connected to ground line 99 and ground line 100. Inside ground ring 159 is a power ring 169 which is connected to power line 69, power line 70 and power line 40. Also, a ground ring 151 is placed on the output perimeter of integrated circuit 1. Inside ground ring 151 is a power ring 161.

Once the pre-formed segments have been placed on the integrated circuit, an expansion routing is performed to join together the pre-formed segments.

Figure 6:
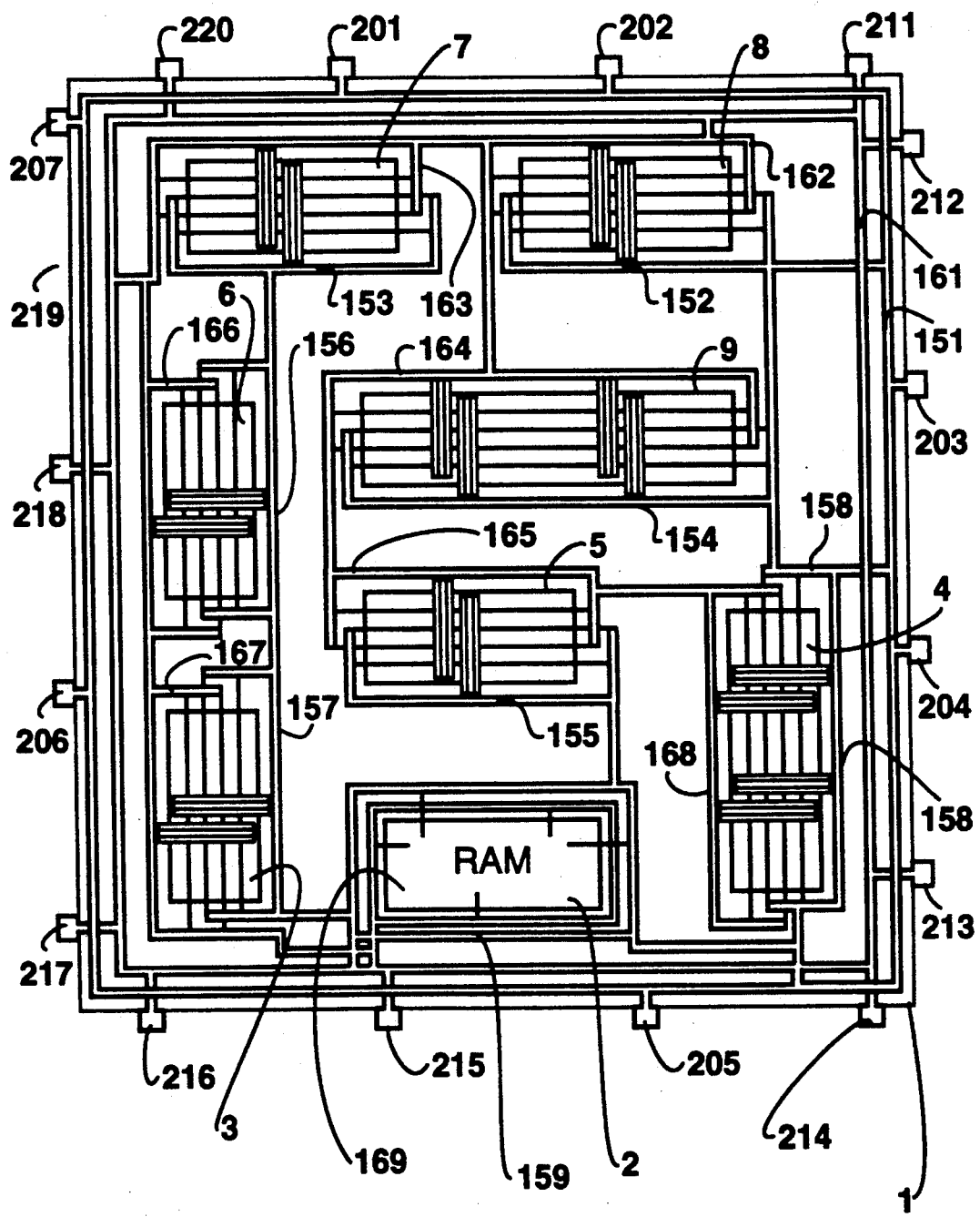
FIG. 6 shows a connection of the pre-formed segments of the power line network and the ground line network shown in FIG. 5 in accordance with the preferred embodiment of the present invention.

FIG. 6 shows the results of an expansion routing performed on the segments shown in FIG. 5. Ground ring 151, ground segment 152, ground segment 153, ground segment 154, ground segment 155, ground segment 156, ground segment 157, ground segment 158 and ground ring 159 have been connected together as a result of the expansion routing. Connected to ground ring 151 is a ground pad 201, a ground pad 202, a ground pad 203, a ground pad 204, a ground pad 205, a ground pad 206 and a ground pad 207. Power ring 161, power segment 162, power segment 163, power segment 164, power segment 165, power segment 166, power segment 167, power segment 168 and power ring 169 have also been connected together as a result of the expansion routing. Connected to power ring 161 is a power pad 211, a power pad 212, a power pad 213, a power pad 214, a power pad 215, a power pad 216, a power pad 217, a power pad 218, a power pad 219, and a power pad 220.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for performing global routing of a power line network and a ground line network on an integrated circuit, the method comprising the steps of:
   (a) placing pre-formed segments of the ground line network adjacent to functional blocks of the integrated circuit;
   (b) connecting ground lines of the functional blocks to the pre-formed segments of the ground line network;
   (c) placing pre-formed segments of the power line network adjacent to the functional blocks of the integrated circuit;
   (d) connecting power lines of the functional blocks to the pre-formed segments of the power line network;
   (e) connecting together the pre-formed segments of the ground line network; and,
   (f) in step (a), for functional blocks which are functional blocks of standard cells, the pre-formed segments of the ground line network are three-sided segments opening towards a first side of the integrated circuit and are three-sided segments opening towards a second side of the integrated circuit; and
   in step (c), for functional blocks which are functional blocks of standard cells, the pre-formed segments of the power line network are three-sided segments opening towards a third side of the integrated circuit and are three-sided segments opening towards a fourth side of the integrated circuit.

2. A method as in claim 1 wherein:
   the first side of the integrated circuit is adjacent to the second side of the integrated circuit; and,
   the third side of the integrated circuit is adjacent to the fourth side of the integrated circuit.

3. A method as in claim 1 where step (e) and step (f) are accomplished using an expansion routing algorithm.

4. A method for performing global routing of a line network on an integrated circuit, the method comprising the steps of:
   (a) placing pre-formed segments of the line network adjacent to functional blocks of the integrated circuit wherein for functional blocks which are functional blocks of standard cells the pre-formed segments of the line network are three-sided segments opening towards a first side of the integrated circuit and are three-sided segments oepning towards a second side of the integrated circuit;
   (b) connecting lines of the functional blocks to the pre-formed segments of the line network; and,
   (c) connecting together the pre-formed segments of the line network.

5. A method as in claim 4 wherein:
   the first side of the integrated circuit is adjacent to the second side of the integrated circuit.

6. A method as in claim 4 where step (c) is accomplished using an expansion routing algorithm.

* * * * *